(12) United States Patent  (10) Patent No.: US 8,060,705 B2
Bowyer                    (45) Date of Patent: Nov. 15, 2011

(54) METHOD AND APPARATUS FOR USING A VARIABLE PAGE LENGTH IN A MEMORY

(75) Inventor: Stephen Bowyer, Raleigh, NC (US)

(73) Assignee: Qimonda AG, Munich (DE)

( * ) Notice: Subject to any disclaimer, the term of this patent is extended or adjusted under 35 U.S.C. 154(b) by 780 days.

(21) Appl. No.: 11/957,307

(22) Filed: Dec. 14, 2007

(65) Prior Publication Data

US 2009/0157983 A1    Jun. 18, 2009

(51) Int. Cl.
G06F 13/00 (2006.01)
(52) U.S. Cl. .................. 711/154; 711/E12.003
(58) Field of Classification Search .......... None
See application file for complete search history.

(56) References Cited

U.S. PATENT DOCUMENTS

| 6,526,533 B1* | 2/2003 | Cowles et al. ............... 714/718 |
| 6,694,422 B1* | 2/2004 | Kim ............................. 711/217 |
| 2003/0088753 A1* | 5/2003 | Ikeda et al. .................. 711/202 |
| 2004/0095835 A1* | 5/2004 | La et al. .................. 365/230.03 |
| 2008/0256319 A1* | 10/2008 | Sutardja ..................... 711/170 |

* cited by examiner

Primary Examiner — Pierre-Michel Bataille
Assistant Examiner — Sean D Rossiter
(74) Attorney, Agent, or Firm — Patterson & Sheridan, LLP

(57) ABSTRACT

A controller, a memory device including a memory array, and a method for accessing the memory device. The method includes, during a first access, activating a first page of the memory array corresponding to a first row address and accessing data from the first page with a first column address. The method further includes, during a second access, activating a first sub-page of the memory array corresponding to a second row address and accessing data from the first sub-page with a second column address. The activated first sub-page of the memory array is smaller than the first page of the memory array. The method further includes activating a second sub-page without receiving a separate activate command.

27 Claims, 5 Drawing Sheets

METHOD AND APPARATUS FOR USING A VARIABLE PAGE LENGTH IN A MEMORY

BACKGROUND OF THE INVENTION

Modern computer systems typically include a processor and a memory device which stores information accessed by the processor. During system operation, the processor may issue access commands to the memory device to access the stored information. The access commands issued by the processor may include read and write commands. For each received access command, the memory device may process the received access command and use the access command to access a memory array which contains the information stored by the memory device.

In many cases, there is a desire to reduce the amount of power consumed by the memory device. For example, the memory device may consume power while processing each access command. In order to reduce the total amount of power consumed by the memory device, there may be a desire to reduce the amount of power consumed by the memory device while processing each access command.

SUMMARY OF THE INVENTION

Embodiments of the invention provide a memory device including a memory array, and a method for accessing the memory device. In one embodiment, the method includes, during a first access, activating a first page of the memory array corresponding to a first row address and accessing data from the first page with a first column address. The method further includes, during a second access, activating a first sub-page of the memory array corresponding to a second row address and accessing data from the first sub-page with a second column address. The activated first sub-page of the memory array is smaller than the first page of the memory array. The method further includes activating a second sub-page without receiving a separate activate command.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
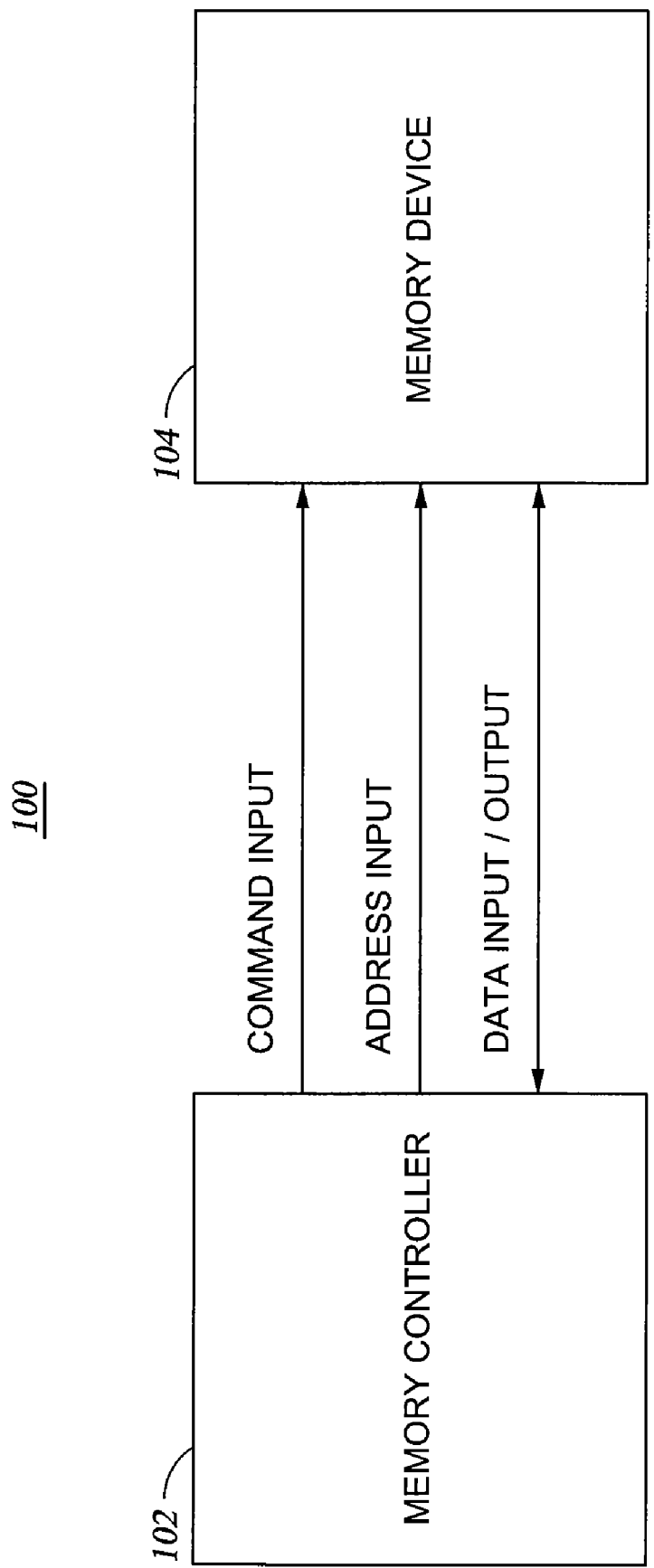
FIGS. 1A-B depict a system including a memory device according to one embodiment of the invention.

Embodiments of the invention provide a controller, a memory device including a memory array, and a method for accessing the memory device. In one embodiment, the method includes, during a first access, activating a first page of the memory array corresponding to a first row address and accessing data from the first page with a first column address. The method further includes, during a second access, activating a first sub-page of the memory array corresponding to a second row address and accessing data from the first sub-page with a second column address. The activated first sub-page of the memory array is smaller than the first page of the memory array. The method further includes activating a second sub-page without receiving a separate activate command. In one embodiment, by providing activation of different page sizes (e.g., pages and sub-pages), activation power within the memory device may be optimized based on the pattern of access commands being issued to the memory device.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

Figure 1B:
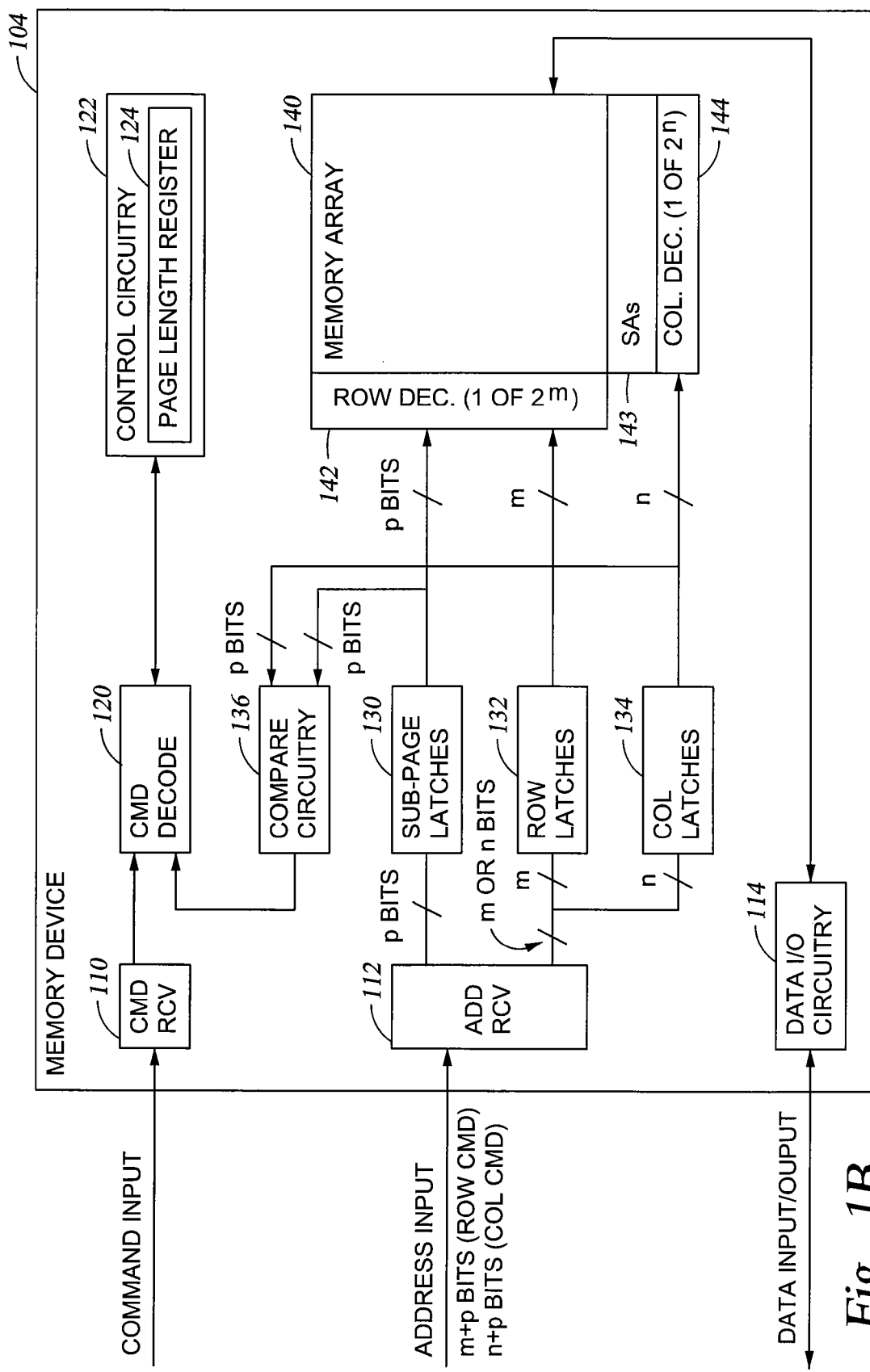

FIGS. 1A-B depict a system 100 including a memory device 104 according to one embodiment of the invention. As depicted in FIG. 1A, a memory controller 102 may be used to access the memory device 104 via command input, address input, and data input/output connections. The memory controller 102 may also be configured to change mode settings of the memory device 104. For example, the memory controller 102 may be configured to change a page size setting used by the memory device 104 as described below.

FIG. 1B is a block diagram depicting circuitry within the memory device 104 according to one embodiment of the invention. The memory device 104 includes command receiver circuitry (CMD RCV) 110, address receiver circuitry (ADD RCV) 112, and data input/output (I/O) circuitry 114. Commands received by the command receiver circuitry 110 are provided to command decoder circuitry 120 which decodes the commands and determines what type of command have been received. The decoded commands are then provided to control circuitry 122 which issues control signals to implement the commands received.

Commands input to the memory device 104 may include mode register set (MRS) commands, precharge commands, activate commands, and access commands. MRS commands may be used to change settings of mode registers within the memory device 104. In one embodiment, the memory device 104 includes a page length register 124 which is used to select a page size used by the memory device 104. In one embodiment, the page length register 124 may also be included and modified as part of another mode register. Also, in an alternative embodiment, the controller 102 may use additional control pins of the memory device 104 to select the page size used by the memory device 104.

Information in the memory device 104 is stored in a memory array 140. As used herein, "array" and "bank" are interchangeable; i.e., arrays are not limited to storage areas that operate in unison as a unit. During activation and access to the memory device 104, a row decoder 142 and a column decoder 144 are used to decode a row address and a column address. As used herein, the row address includes m address bits and is used to activate $2^m$ rows of data. The column address includes n address bits and is used to access $2^n$ columns of data. The row address is received with an activation command and stored in row latches 132. The column address is received with an access command (e.g., a read or a write command) and stored in column latches 134. The decoded row address and column address are used to select a location for data to be read from or written to the memory array 140.

In one embodiment, data in the memory array may be stored, activated, and accessed using pages. A "page" is the set of memory cells that is stored into sense amps 143 during a row (wordline) activation and an activated page is available for future column read/write operations as described below.

Embodiments of the invention allow for activation and access of different page sizes. For example, in one embodiment, the page length register 124 is used to select a page length used by the memory device 104. Thus, during a first memory activation and access, the memory device 104 may activate and access data using a first page size (e.g., a full page size, corresponding to a page length register setting of '00'). The page of the first page size is driven into the sense amps 143. During a second memory activation and access, the memory device 104 may activate and access data using a second page size which is smaller than the first page size (e.g., a sub-page size, corresponding to a page length register setting of '01'). During the second memory access, the sub-page page of the second memory access is driven into the sense amps 143. In one embodiment, different sized groups of sense amps are used during the first and second memory access, respectively. In particular, the group of sense amps needed for the second memory access may be smaller than the group of sense amps needed for the first memory access, due to the different page sizes. Accordingly, the power consumed by the sense operation during the second memory access may be less relative to the first memory access.

According to one embodiment, a "full page" is designated as the largest page length setting of the memory device 104. For example, a full page may correspond to an entire row of the array. Smaller variable page lengths are described as "sub-pages" of this maximum page length. As described below, by using a variable page size to activate and access data, power consumed by the memory device 104 while activating a given page/sub-page and accessing data from the page/sub-page may be reduced.

Figure 2:
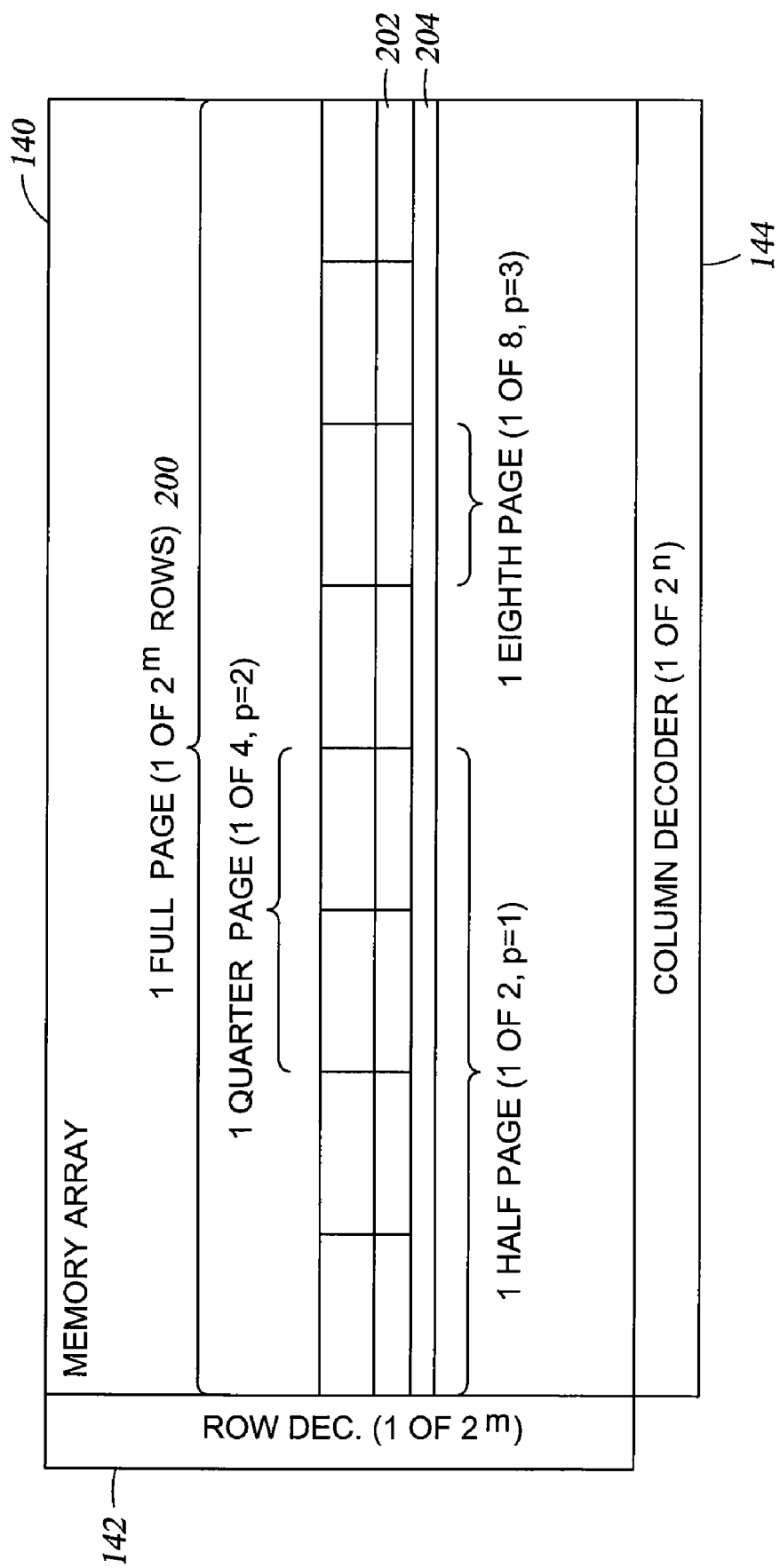
FIG. 2 is a block diagram depicting variable page length activation according to one embodiment of the invention.

FIG. 2 is a block diagram depicting a page 200 in the memory array 140 according to one embodiment of the invention. During activation and access to data stored in the page 200, an activate command is issued to the command receiver circuitry 110 of the memory device 104 along with a row address (m bits) and a page address (p bits) to the address receiver circuitry 112. After the row address is decoded by the row decoder 142, one or more portions of a wordline 202 corresponding to the page address is activated. For example, if the memory device 104 is placed in a full page mode by writing a full page setting to the page length register 124, then the entire wordline 202 is activated. If the memory device 104 is placed in a half-page mode by writing a half-page setting to the page length register 124, then half of the wordline 202 corresponding to the page address is activated. For example, if the page address is '0', then the portion of the wordline 202 corresponding to the first half of the page 200 is activated. If the page address is '1', then the portion of the wordline 202 corresponding to the second half of the page 200 is activated. After the one or more portions of the wordline 202 corresponding to the page address is activated, the data bits in the page are sensed and amplified by the sense amps 130 corresponding to the page being activated.

In one embodiment, the wordline 202 is divided into a plurality of local wordlines. Where a sub-page size is being activated, only the local wordlines corresponding to the sub-page may be activated. Thus, the page address is decoded at the local wordline level in order to individually activate the local wordlines corresponding to that sub-page. In one embodiment, the number of individually controlled local wordlines corresponds to the smallest page size available for the memory device 104. For example, if the memory device 104 provides an option to activate and access a ⅛ page size (with a page length register setting of '11' and with p=3 bits used to indicate the sub-page address), then the wordline 202 is divided into eight local wordlines which may be individually activated where appropriate. Where the wordline 202 is divided into eight local wordlines and a quarter-page size setting ('10', with p=2 bits used to indicate the sub-page address) is selected using the page length register 124, then during each wordline activation, two of the eight local wordlines are activated. By reducing the number of local wordlines being activated during sub-page activation, power consumption of the memory device 104 may be reduced.

In one embodiment, only one sub-page of a given row is activated at a given time. In another embodiment, multiple sub-pages of a given row within the memory array 140 may be placed in an active state using multiple activate commands. For example, multiple activate commands may be issued sequentially to the memory device 104, and each sub-page address indicated by the respective multiple activate commands may be placed in an active state in preparation for subsequent access as described below.

After an activation command is received by the memory device 104, an access command (e.g., a read or a write command) may be received by the memory device 104. The access command may be received with a column address which indicates the column of the memory array 140 where the data is to be read out of or written into the sense amps. Thus, the access command selects one column of data from a previously activated page or sub-page(s). Each access command selects the same number of individual sense amps based on the width of the data bus coming out of the memory device 104.

The length of the column address during an access may vary according to different embodiments. In one embodiment, the page/sub-page address from the previously received activation command (i.e., the p bits) may be used to indicate which page/sub-page address is accessed with the access command (e.g., a portion of the column address may be derived from the previously received sub-page address). For example, according to one embodiment, assuming that n bits are needed for a full page access, only n−p bits of the column address need be provided with the column command for accessing a single activated sub-page of a given row, because the p bits from the row activation are used to as the column sub-page address that completes the entire column address. This column addressing scheme is appropriate for the embodiment described above in which only one sub-page is activated for a given row.

In another embodiment, the access command is also received with a page/sub-page address. In one embodiment, the sub-page address to be accessed is provided within the n column address bits. The page/sub-page address may be used to indicate the page/sub-page to be accessed. This column addressing scheme is appropriate for the embodiment described above in which multiple sub-pages of a given row are placed in an active state using sequentially received activate commands.

It is also contemplated, that during a given access in which a current sub-page is activated, another sub-page of the same row may be activated in parallel with the given column access. Such an activation is referred to herein as a "hidden" sub-page activation and, according to one embodiment, requires "n+p" column address bits. In one embodiment, where the memory device 104 is placed in a sub-page mode, the row sub-page address received with a column access command may be compared to the row sub-page address received with the previous row activation command (or previous activation commands, if multiple commands were issued sequentially). If the previously received row sub-page address or addresses do not match the new row sub-page address provided with the access command, then a hidden activation of the sub-page corresponding to the new sub-page address may be performed. In other words, when a new row sub-page address is provided with an access command, one or more portions of a wordline 202 corresponding to the new row sub-page address may be activated while the received access command may be used to access one of the currently activated sub-pages. By performing the hidden sub-page activation, additional sub-pages may be activated and accessed without using additional activation commands.

Referring to FIG. 1B, the row sub-page address received with the activation command may be stored in the sub-page latches 130 and the compare circuitry 136 may be used to compare the latched sub-page address to the subsequently received row sub-page address received with a given access command. Upon determining that the latched row sub-page address does not match the row sub-page address received with the given access command, the command decoder 120 may provide appropriate control signals causing the hidden activation to be performed. Subsequently issued sub-page addresses received with access commands may also be used to perform additional sub-page activations as described above.

Figure 3:
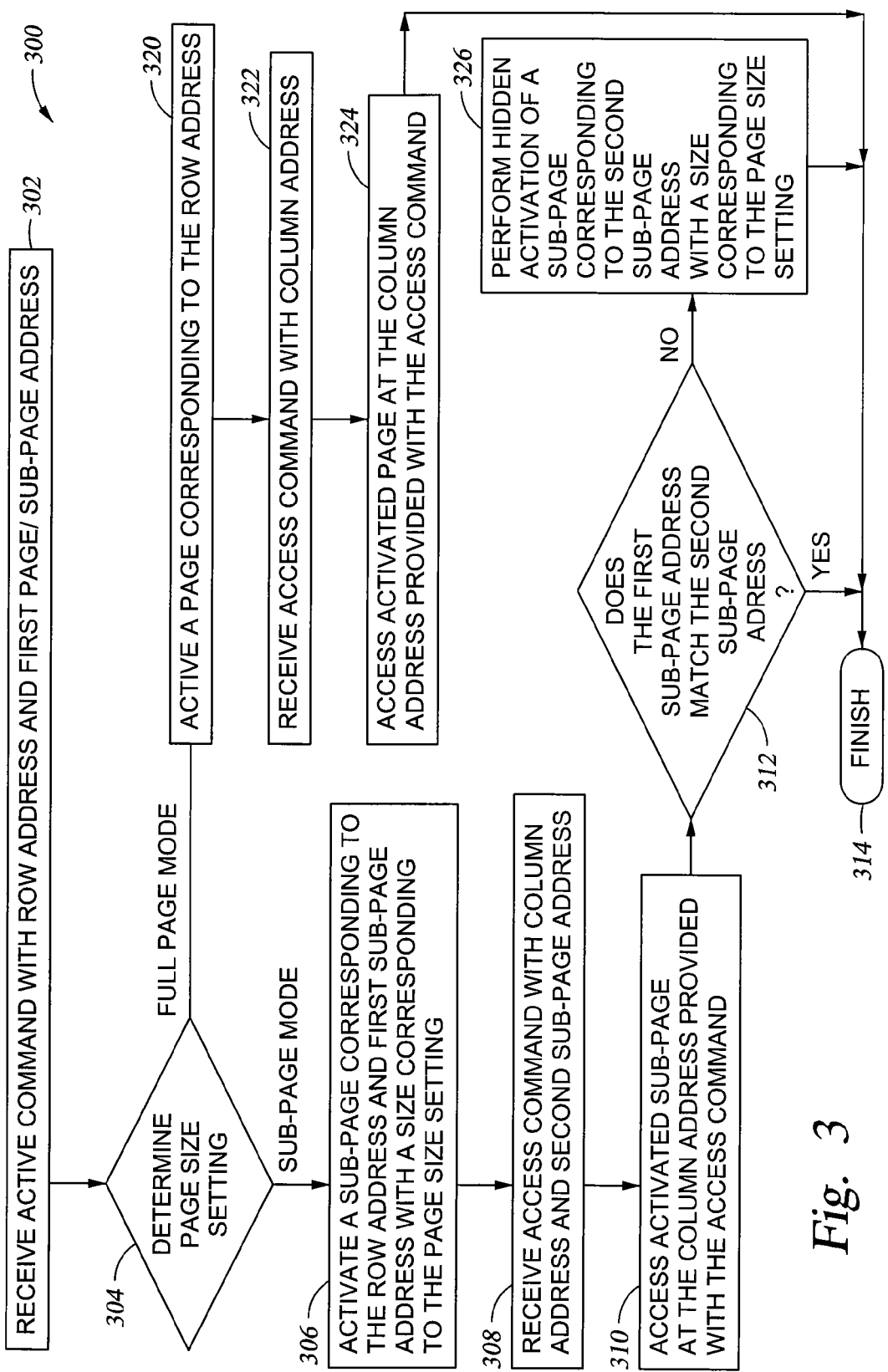
FIG. 3 is a flow diagram depicting a method for accessing a memory device with a variable page length according to one embodiment of the invention.

FIG. 3 is a flow diagram depicting a method 300 for accessing a memory device with a variable page length according to one embodiment of the invention. The method begins at step 302 where an activate command is received along with a row address and a page/sub-page address. At step 304, a determination of the page size setting in the page length register 124 is made. If the memory device 104 is in the full page mode, then at step 320 a full page corresponding to the row address is activated. Then, at step 322, an access command and column address are received. Then, at step 324, the activated page is accessed at the column address provided with the access command.

If, at step 304, a determination is made that the memory device 104 is in a sub-page mode, then at step 306 a sub-page corresponding to the row address and first sub-page address with a size corresponding to the page size setting is activated. Then, at step 308, an access command with a column address and a second sub-page address is received. At step 310, the sub-page activated with the first sub-page address is accessed with the column address and the access command. Then, at step 312, a determination is made of whether the first sub-page address received with the activate command matches the second sub-page address received with the access command. If not, then a hidden activation of the sub-page corresponding to the second sub-page address is performed at step 326.

Figure 4:
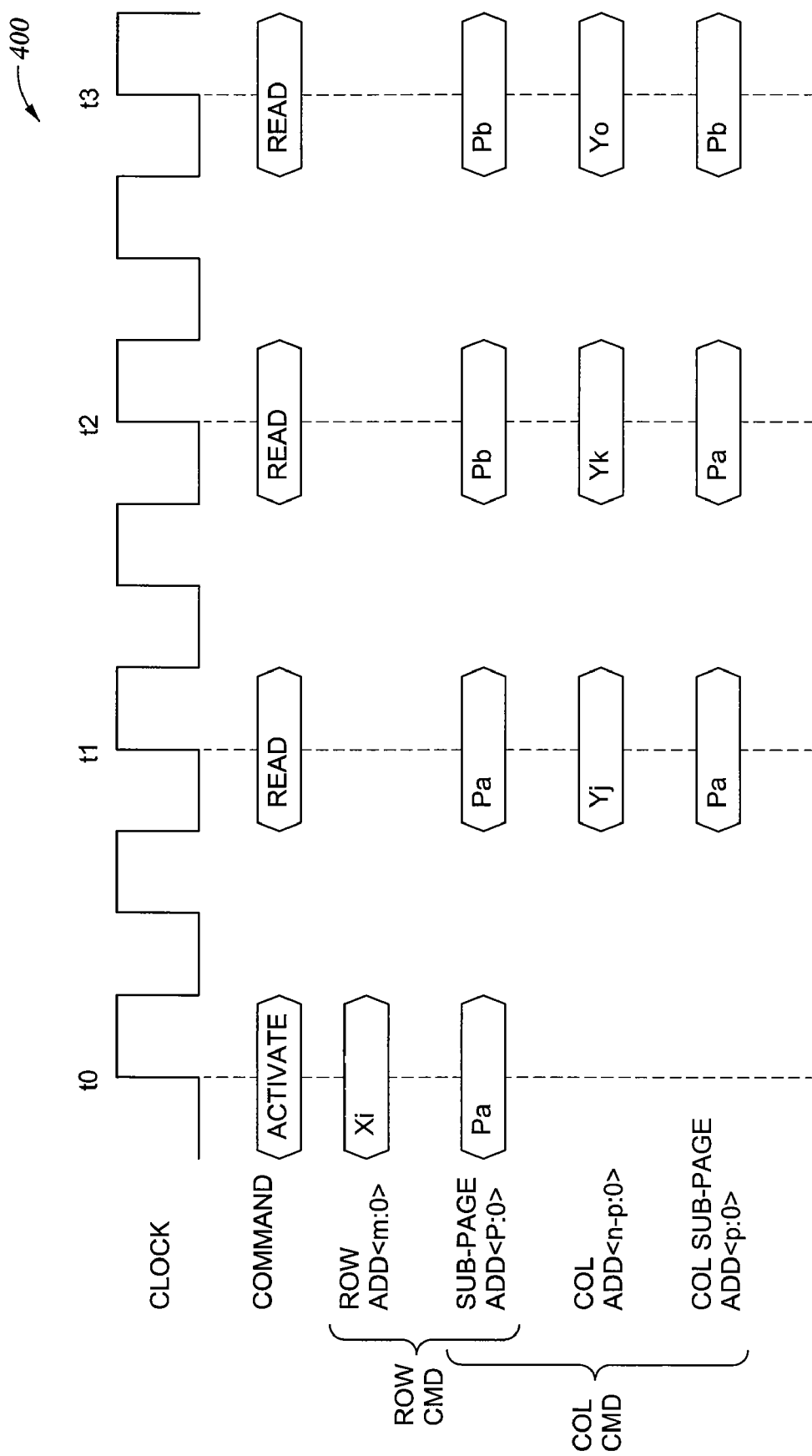
FIG. 4 is a timing diagram depicting an access of a memory device with a variable page length according to one embodiment of the invention.

FIG. 4 is a timing diagram 400 depicting an access of a memory device with a variable page length according to one embodiment of the invention. As depicted, at time t0, a row activate command is given to sub-page "Pa" of row address "Xi." As described above, the row address is supplied using "m" bits and the sub-page address is provided using "p" bits. Then, at time t1, a column access command is given to column "Yj" of the active row/sub-page. The column address is supplied using a total of "n" column address bits and address bits for a sub-page address, "Pa". The "n" column address bits include "p" address bits indicating the sub-page being accessed by the access command, and the remaining "n−p" column address bits pick the individual column address within a single sub-page of the sense amps. The "p" column address bits should match at least one sub-page which is in an active state (e.g., a sub-page which was placed in an active state by a previous activate command). The column access command is received along with a second sub-page address ("Sub-Page Add<p:0>"), Pa. Since the sub-page address "Pa" received at time t1 matches an already active sub-page (Pa received at time t0), a new sub-page will not be activated.

At time t2, a column access command is given to column "Yk" of the active row/sub-page. However, in this case, the row sub-page Pb does not match an activated sub-page Pa. Therefore, in parallel to the column operation at time t2, the new sub-page "Pb" will be activated. Then, at time t3, a column access command is given to column "Yo" of the newly activated row/sub-page "Pb." Note that while shown separately in FIG. 4 for clarity, the row and column addresses may be multiplexed on the same address bus.

As described above, embodiments of the invention provide for activation of different page sizes (e.g., pages and sub-pages) within the memory array 140 of a memory device 104. By providing activation of different page sizes within the memory array 140, activation power within the memory device 140 may be optimized based on the amount of data being accessed within the memory device 140. The power savings results from using smaller portions of the sense amps for relatively smaller page sizes.

While the foregoing is directed to embodiments of the present invention, other and further embodiments of the invention may be devised without departing from the basic scope thereof, and the scope thereof is determined by the claims that follow.

What is claimed is:

1. A method for accessing a memory device comprising a memory array, the method comprising:
   during a first access, activating a first page of the memory array corresponding to a first row address and accessing data from the first page with a first column address;
   during a second access:
      in response to a first activate command from a memory controller, activating a first sub-page of the memory array corresponding to a second row address and accessing data from the first sub-page with a second column address, wherein the activated first sub-page of the memory array is smaller than the first page of the memory array; and
      after activating the first sub-page, activating a second sub-page without receiving a separate activate command from the memory controller, wherein the activated first and second sub-pages of the memory array both correspond to the second row address and are activated simultaneously.

2. The method of claim 1, wherein the first page defines a maximum page size capable of being read from the memory device for a given activation of the memory array and wherein the first sub-page is a portion of the second page of the memory array.

3. The method of claim 1, further comprising:
   during a third access occurring while the first sub-page is activated:
      receiving a third column address with an access command; and
      receiving a third sub-page address corresponding to a third sub-page with the access command;
   determining if the third sub-page address is different from a first sub-page address for the first sub-page; and
   upon determining that the third sub-page address is different from the first sub-page address for the first sub-page, activating the third sub-page without receiving the separate activate command.

4. The method of claim 1, wherein the first sub-page is a sub-page of the first page, and further comprising:
   during activation of the first page, activating at least a first local wordline and a second local wordline of the first page; and
   during activation of the first sub-page, activating the first local wordline without activating the second local wordline.

5. The method of claim 1, wherein the first sub-page is a sub-page of the first page, and further comprising:
   during access of the first page, performing a first sense operation with a first group of sense amps; and
   during access of the first sub-page, performing a second sense operation with a second group of sense amps, wherein the second group of sense amps is smaller than the first group of sense amps.

6. The method of claim 1, wherein the first page of the memory array is activated when a first page size setting is provided to a register of the memory device, and wherein the first sub-page of the memory array is activated when a second page size setting is provided to the register of the memory device.

7. A memory device, comprising:
   a memory array; and
   circuitry configured to:
      during a first access, activate a first page of the memory array corresponding to a first row address and accessing data from the first page with a first column address;
      during a second access:
         in response to a first activate command from a memory controller, activate a first sub-page of the memory array corresponding to a second row address and accessing data from the first sub-page with a second column address, wherein the activated first sub-page of the memory array is smaller than the first page of the memory array; and
         after activating the first sub-page, activate a second sub-page without receiving a separate activate command from the memory controller, wherein the activated first and second sub-pages of the memory array both correspond to the second row address and are activated simultaneously.

8. The memory device of claim 7, wherein the first page defines a maximum page size capable of being read from the memory device for a given activation of the memory array and wherein first sub-page is a portion of the first page of the memory array.

9. The memory device of claim 7, where the circuitry is further configured to:
   during a third access occurring while the first sub-page is activated:
      receive a third column address with an access command; and
      receive a third sub-page address corresponding to a third sub-page with the access command;
   determine if the third sub-page address is different from a first sub-page address for the first sub-page; and
   upon determining that the third sub-page address is different from the first sub-page address for the first sub-page, activate the third sub-page without receiving the separate activate command.

10. The memory device of claim 7, wherein the first sub-page is a sub-page of the first page, and wherein the circuitry is further configured to:
during activation of the first page, activate at least a first local wordline and a second local wordline of the first page; and
during activation of the first sub-page, activate the first local wordline without activating the second local wordline.

11. The memory device of claim 7, wherein the first sub-page is a sub-page of the first page, and wherein the circuitry is further configured to:
during access of the first page, performing a first sense operation with a first group of sense amps; and
during access of the first sub-page, performing a second sense operation with a second group of sense amps, wherein the second group of sense amps is smaller than the first group of sense amps.

12. The memory device of claim 7, wherein the circuitry is configured to activate first page of the memory array when a first page size setting is provided to a register of the memory device, and wherein the circuitry is configured to activate the first sub-page of the memory array when a second page size setting is provided to the register of the memory device.

13. A method for accessing a memory device comprising a memory array, the method comprising:
setting a first page size selected from at least two different page sizes, and then:
performing a first plurality of access operations with respect to the memory array; wherein the pages accessed in the memory array have a size determined by the first page size; and
setting a second page size selected from the at least two different page sizes, wherein the second page size is smaller than the first page size, and then:
in response to a first activate command from a memory controller, performing a second plurality of access operations with respect to the memory array; wherein the pages accessed in the memory array have a size determined by the second page size, and wherein, after activating at least one of the pages having the second page size, activating a different page having the second page size without receiving a separate activation command from the memory controller, wherein the activated at least one of the pages and the activated different page both correspond to a same row address and are activated simultaneously.

14. The method of claim 13, wherein performing the first plurality of access operations comprises
activating a page in a row of the memory array according to a row address and page address received with an activation command; the activated page having a size determined by the first page size; and
accessing the activated page at a column address.

15. The method of claim 13, wherein performing the first plurality of access operations comprises:
activating a first page in a row of the memory array according to a row address and first row page address received with an activation command; the activated first page having a size determined by the first page size;
receiving a column access command inclusive of a column address specifying a column of the first activated page to access, and wherein the column access command further includes a second row page address;
comparing the first row page address and the second row page address; and
activating a second page at the second row page address in response to determining that the first row page address and the second row page address are different.

16. The method of claim 13, wherein:
performing the first plurality of access operations with respect to the memory array, comprises:
activating a first page by activating at least a first local wordline and a second local wordline of the page, wherein the page has a size determined by the first page size; and
performing the second plurality of access operations with respect to the memory array, comprises:
activating a second page by activating the first local wordline without activating the second local wordline.

17. The method of claim 16, wherein:
performing the first plurality of access operations with respect to the memory array, comprises:
performing a first sense operation with a first group of sense amps; and
performing the second plurality of access operations with respect to the memory array, comprises:
performing a second sense operation with a second group of sense amps, wherein the second group of sense amps is smaller than the first group of sense amps.

18. A method for accessing a memory device comprising a memory array, comprising:
receiving a first activation command;
in response to receiving the first activation command, activating a first sub-page of the memory array;
while the first sub-page of the memory array is activated:
receiving a second activation command; and
in response to receiving the second activation command, activating a second sub-page of the memory array, wherein the first sub-page and the second sub-page of the memory array are in an active state simultaneously, wherein the first sub-page and the second sub-page are both different sub-pages of a single page.

19. The method of claim 18, wherein page sizes of the first sub-page and the second sub-page are both less than a maximum page size capable of being read from the memory array.

20. The method of claim 18, further comprising:
while the first sub-page and the second sub-page are in the active state, receiving an access command for accessing a column within the second sub-page.

21. The method of claim 20, further comprising:
after accessing the column within the second sub-page, receiving an access command for accessing a column within the first sub-page.

22. The method of claim 18, further comprising:
activating a third sub-page without receiving a separate activate command.

23. A memory device, comprising:
a memory array; and
circuitry configured to:
receive a first activation command;
in response to receiving the first activation command, activate a first sub-page of the memory array;
while the first sub-page of the memory array is activated:
receive a second activation command; and
in response to receiving the second activation command, activate a second sub-page of the memory array, wherein the first sub-page and the second sub-page of the memory array are in an active state simultaneously, and wherein the first sub-page and the second sub-page are both different sub-pages of a single page.

24. The memory device of claim 23, wherein page sizes of the first sub-page and the second sub-page are both less than a maximum page size capable of being read from the memory array.

25. The memory device of claim 23, wherein the circuitry is further configured to:
while the first sub-page and the second sub-page are in the active state, receive an access command for accessing a column within the second sub-page.

26. The memory device of claim 25, wherein the circuitry is further configured to:
after accessing the column within the second sub-page, receive an access command for accessing a column within the first sub-page.

27. The memory device of claim 23, wherein the circuitry is further configured to:
activate a third sub-page without receiving a separate activate command.

* * * * *